United States Patent
Liu et al.

(10) Patent No.: US 11,670,648 B2
(45) Date of Patent: Jun. 6, 2023

(54) FLICKER-MITIGATING PIXEL-ARRAY SUBSTRATE

(71) Applicant: OmniVision Technologies, Inc., Santa Clara, CA (US)

(72) Inventors: Yuanliang Liu, San Jose, CA (US); Hui Zang, San Jose, CA (US)

(73) Assignee: OmniVision Technologies Inc., Santa Clara, CA (US)

( * ) Notice: Subject to any disclaimer, the term of this patent is extended or adjusted under 35 U.S.C. 154(b) by 162 days.

(21) Appl. No.: 17/118,230

(22) Filed: Dec. 10, 2020

(65) Prior Publication Data
US 2022/0190009 A1    Jun. 16, 2022

(51) Int. Cl.
*H01L 27/146* (2006.01)
*H04N 23/745* (2023.01)

(52) U.S. Cl.
CPC .... *H01L 27/14605* (2013.01); *H01L 27/1461* (2013.01); *H01L 27/1463* (2013.01); *H01L 27/14607* (2013.01); *H01L 27/14623* (2013.01); *H01L 27/14643* (2013.01); *H04N 23/745* (2023.01)

(58) Field of Classification Search
CPC ......... H01L 27/14605; H01L 27/14607; H01L 27/1461; H01L 27/14623; H01L 27/1463; H01L 27/14643; H01L 27/14683; H01L 27/14603; H04N 5/2357; H04N 23/745
See application file for complete search history.

(56) References Cited

U.S. PATENT DOCUMENTS

| | | | |
|---|---|---|---|
| 9,160,953 B2 | 10/2015 | Oishi | |
| 9,202,841 B1* | 12/2015 | Xing | H01L 27/14625 |
| 9,443,899 B1 | 9/2016 | Liu et al. | |
| 9,659,989 B1 | 5/2017 | Ai et al. | |
| 2016/0276394 A1 | 9/2016 | Chou et al. | |
| 2018/0033809 A1* | 2/2018 | Tayanaka | H01L 27/14 |
| 2018/0091723 A1* | 3/2018 | Funaki | H04N 5/37452 |
| 2018/0308883 A1 | 10/2018 | Yanagita et al. | |

(Continued)

OTHER PUBLICATIONS

U.S. Appl. No. 17/118,252 Non-Final Office Action dated Sep. 14, 2022, 17 pages.

*Primary Examiner* — Albert H Cutler
(74) *Attorney, Agent, or Firm* — Cozen O'Connor

(57) ABSTRACT

A flicker-mitigating pixel-array substrate includes a semiconductor substrate and a metal layer. The semiconductor substrate includes a small-photodiode region. A back surface of the semiconductor substrate forms a trench surrounding the small-photodiode region in a cross-sectional plane parallel to a first back-surface region of the back surface above the small-photodiode region. The metal layer covers the first back-surface region, at least partially fills the trench, and surrounds the small-photodiode region in the cross-sectional plane. A method for fabricating a flicker-mitigating pixel-array substrate includes forming, on a back surface of a semiconductor substrate, a trench that surrounds a small-photodiode region of the semiconductor substrate in a cross-sectional plane parallel to a first back-surface region of the back surface above the small-photodiode region. The method also includes forming a metal layer on the first back-surface region and in the trench.

18 Claims, 6 Drawing Sheets

(56) References Cited

U.S. PATENT DOCUMENTS

| | | |
|---|---|---|
| 2020/0043962 A1 | 2/2020 | Cho |
| 2020/0227467 A1 | 7/2020 | Yokogawa |
| 2021/0193727 A1 | 6/2021 | Asatsuma et al. |
| 2021/0391361 A1 | 12/2021 | Huang et al. |

* cited by examiner

FLICKER-MITIGATING PIXEL-ARRAY SUBSTRATE

BACKGROUND

Cameras installed on a motor vehicle include an image sensor having a pixel array. The pixel array includes a first group of pixels configured for bright-light detection and a second group of pixels configured low-light detection. Images and video captured by such cameras often include flicker artifacts caused by daytime running lights of the motor vehicle. The light-generating elements of the daytime running lights are light-emitting diodes which flicker at rates of approximately one hundred hertz.

In addition to flicker artifacts, a second image artifact common to motor-vehicle camera is called petal flare. Each of the first and second groups of pixels are arranged in a two-dimensional periodic array with a pixel pitch that is between two and three times the wavelength of light incident thereon. Many image sensors include a microlens array, formed of a plurality of microlenses each aligned to a respective pixel, that has two-dimensionally periodic surface height above the pixel array. The periodicity of the image sensor's pixel array and microlens array thereon result in the image sensor resembling a reflective two-dimensional diffraction grating. Part of light incident on the image sensor is diffracted toward the camera's imaging lens. Different elements of the camera, e.g., a cover glass, an IR-cut filter, a surface of the imaging lens, reflect this diffracted light back toward the image sensor, which produces petal flare.

SUMMARY OF THE EMBODIMENTS

Embodiments disclosed herein mitigate flicker artifacts and petal flare by, for each pixel of the first group of pixels, integrating a metal film located above the pixel's photodiode with a metal that fills a trench surrounding the pixel.

In a first aspect, a flicker-mitigating pixel-array substrate includes a semiconductor substrate and a metal layer. The semiconductor substrate includes a small-photodiode region. A back surface of the semiconductor substrate forms a trench surrounding the small-photodiode region in a cross-sectional plane parallel to a first back-surface region of the back surface above the small-photodiode region. The metal layer covers the first back-surface region, at least partially fills the trench, and surrounds the small-photodiode region in the cross-sectional plane.

In a second aspect, a method for fabricating a flicker-mitigating pixel-array substrate includes forming, on a back surface of a semiconductor substrate, a trench that surrounds a small-photodiode region of the semiconductor substrate in a cross-sectional plane parallel to a first back-surface region of the back surface above the small-photodiode region. The method also includes forming a metal layer on the first back-surface region and in the trench.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
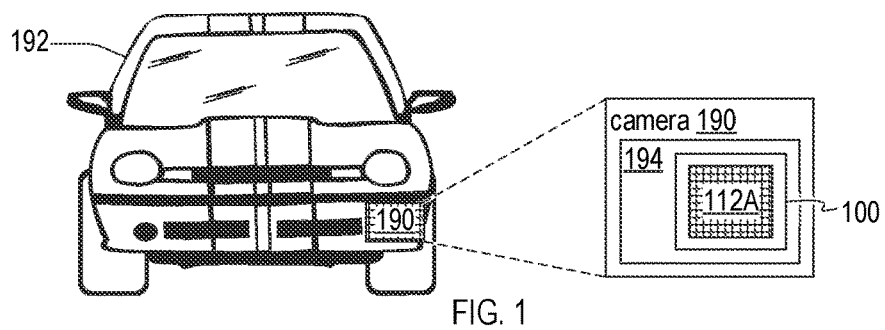
FIG. 1 is schematic of a vehicle, a camera mounted thereon that includes an image sensor.

FIG. 1 is schematic of a camera 190 mounted on a vehicle 192. Camera 190 includes an image sensor 194, which includes a pixel-array substrate 100. FIG. 1 is an example use scenario of image sensor 194 and pixel-array substrate 100, each of which may be used in other high-dynamic range imaging applications without departing from the scope hereof. Pixel-array substrate 100 includes a pixel-array 112A. Pixel-array substrate 100 may part of a chip-scale package or a chip-on-board package.

Figure 2:
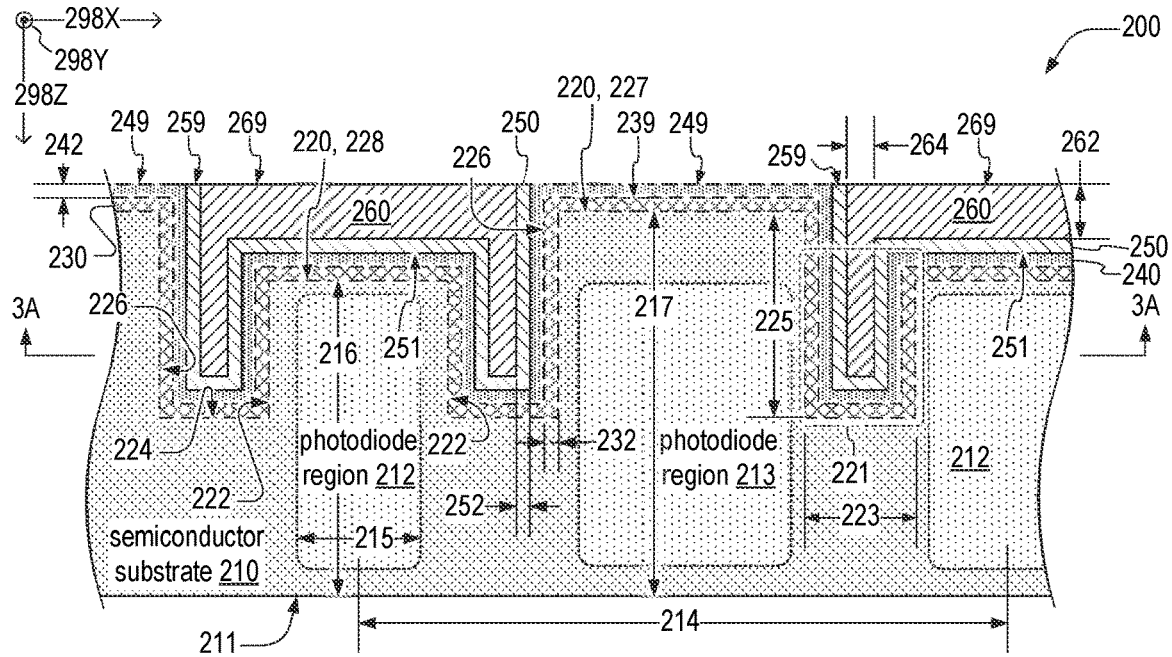
FIGS. 2 and 3 are respective schematics of a flicker-mitigating pixel-array substrate of the camera of FIG. 1, in an embodiment.
Figure 3:
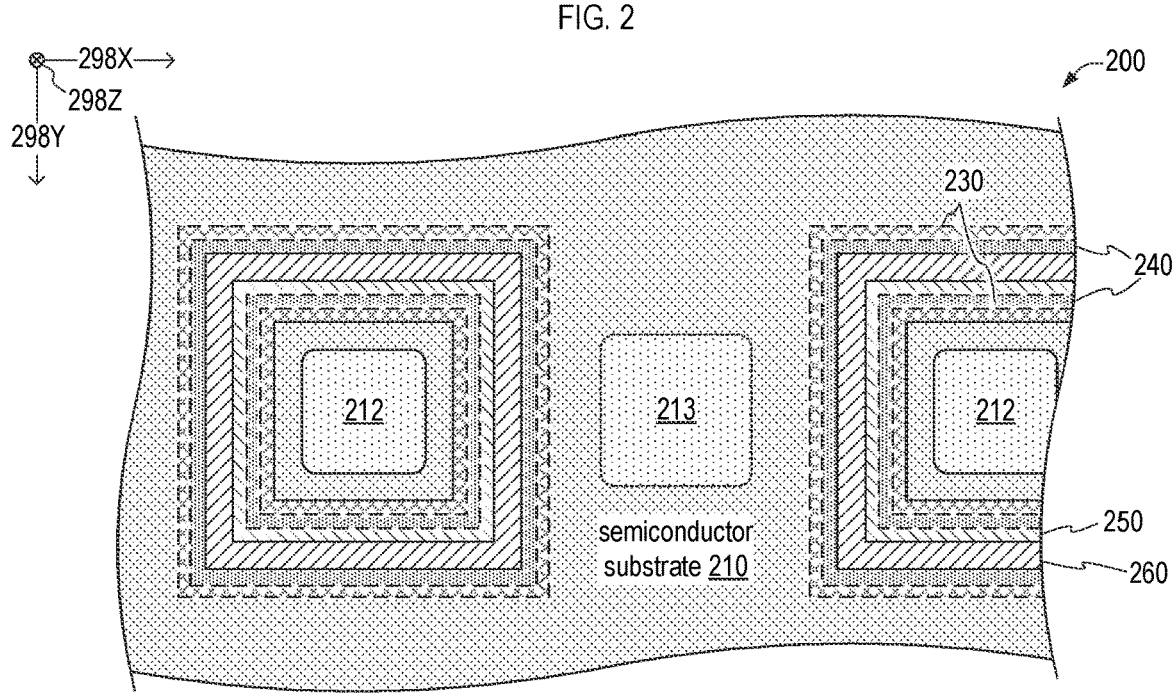

FIGS. 2 and 3 are respective cross-sectional schematics of a flicker-mitigating pixel-array substrate 200, herein after also pixel-array substrate 200. The cross-section illustrated in FIG. 2 is parallel to a plane, hereinafter the x-z plane, formed by orthogonal axes 298X and 298Z, which are each orthogonal to an axis 298Y. Herein, the x-y plane is formed by orthogonal axes 298X and 298Y, and planes parallel to the x-y plane are referred to as transverse planes. Unless otherwise specified, heights of objects herein refer to the object's extent along axis 298Z. Herein, a reference to an axis x, y, or z refers to axes 298X, 298Y, and 298Z respectively. Also, herein, a horizontal plane is parallel to the x-y plane, a width refers to an object's extent along the y axis, and vertical refers to a direction along the z axis. The cross-sectional view of FIG. 3 is in a cross-sectional plane 3A denoted in FIG. 2.

Pixel-array substrate 200 is an example of pixel-array substrate 100 of image sensor 194 and includes a semiconductor substrate 210 and a metal layer 260. Constituent elements of semiconductor substrate 210 may include at least one of silicon and germanium. Semiconductor substrate 210 includes a front surface 211, a back surface 220, and a small-photodiode region 212. Back surface 220 includes in inner-sidewall surface-region 222, an outer-sidewall surface-region 226, and a bottom surface-region 224 that form a trench 221 that surrounds small-photodiode region 212. In embodiments, surface-region 228 forms part of a bottom surface of trench 221, such that part of trench 221 is above photodiode region 212, that is, above surface region 228. FIG. 2 denotes a surface-region 228 of back surface 220 above small-photodiode regions 212. In cross-sectional plane 3A parallel to back-surface region 228, trench 221 surrounds small-photodiode region 212 and isolates small-photodiode region 212 from adjacent large-photodiode regions 213. In embodiments, pixel-array substrate 200 includes at least one of a passivation layer 230, an etch-stop layer 240, and an adhesion layer 250. In embodiments, adhesion layer 250 functions as a diffusion barrier layer. In embodiments, pixel-array substrate lacks adhesion layer 250.

Metal layer 260 is deposited on small photodiode region 212 and at least partially fills trench 221 to reduce amount of light received by small photodiode region 212. A portion of metal layer 260 is formed in the semiconductor substrate 210. The part of metal layer 260 in trench 221 reduces cross-talk while the part of metal layer 260 above surface-region 228 reduces light intensity of incident light that reaches small photodiode region 212, thus preventing small photodiode region 212 from saturation during integration, and reducing flicker artifacts. Whereas conventional pixel-array substrates employ separate structures to address cross-talk and flicker artifacts, pixel-array substrate 200 includes one structure—metal layer 260—that performs both functions, thereby simplifying fabrication processes associated with forming pixel-array substrate 200.

In embodiments, materials constituting metal layer 260 include at least one of tungsten and aluminum, both of which are well-suited for integrated circuit fabrication processes and for attenuating light be a desired about at thicknesses of metal layer 260 disclosed herein. Tungsten and aluminum are absorptive at visible and near-IR wavelengths, and hence reduce petal flare artifacts by absorbing diffracted light incident thereon.

Above surface-region 228, metal layer 260 has a thickness 262 which, in embodiments, is between a minimum thickness of 0.1 micrometers and a maximum thickness of 0.3 micrometers. In trench 221, metal layer 260 has a width 264, which in embodiments, is between a minimum width of twenty nanometers and a maximum width of one hundred nanometers configured based on the desired light sensitivity or quantum efficiency (QE) associated with the small photodiode region 212.

Adhesion layer 250 may be disposed between metal layer 260 and back surface 220 to provide adhesion between metal layer 260 and underneath material layers and prevent metal ions diffusion into semiconductor substrate 210. Adhesion layer 250 covers surface-region 228 (e.g., light exposure area of small photodiode region) and extends into trench 221 between (i) metal layer 260 and inner-sidewall surface-region 222 and between (ii) metal layer 260 outer-sidewall surface-region 226. In embodiments, adhesion layer 250 extends from a first side of trench 221 across surface-region 228 above respective small photodiode region 212 to a second side of trench 221 opposite the first side. In embodiments, adhesion layer 250 does not cover the surface region above large-photodiode region 213. In embodiments, materials forming adhesion layer 250 include at least one of titanium and titanium nitride. Adhesion layer 250 has a thickness 252. In embodiments, thickness 252 is between twenty nanometers and fifty nanometers. Thickness 252 may be in vertical and/or horizontal direction. Adhesion layer 250 has a thickness 252. In embodiments, thickness 252 is between twenty nanometers and fifty nanometers. Thickness 252 may be in vertical and/or horizontal direction.

Passivation layer 230 covers back-surface region 228 and is located between metal layer 260 and semiconductor substrate 210. In embodiments, passivation layer 230 adjoins back surface 220. In embodiments, an additional material layer is between passivation layer and back surface 220. The additional layer may be thinner than passivation layer 230, and may be formed of an oxide.

Passivation layer 230 may conformally cover surface-regions 222, 224, and 226 of trench 221. Passivation layer 230 may be formed of a high-κ material, e.g., a material having a dielectric constant κ greater than or equal that of silicon nitride (κ≥7). Passivation layer 230 may have fixed negative charges creating a hole accumulation layer at its surface interface with semiconductor substrate 210. In embodiments, example materials forming passivation layer 230 include aluminum oxide ($Al_2O_3$), hafnium oxide ($HfO_2$), and combinations thereof. Passivation layer 230 has a thickness 232 which, in embodiments, is between a minimum thickness of ten angstroms and a maximum thickness of five hundred angstroms. When thickness 232 is less than the minimum thickness, passivation layer 230 may no longer functions as an effective passivation layer as amount of fixed negative charges a material layer contained is related to the thickness thereof. When thickness 232 exceeds the maximum thickness, the excess thickness does not improve functioning of passivation layer 230, and hence needlessly increases the overall thickness of pixel-array substrate 200.

Etch-stop layer 240 is between metal layer 260 and passivation layer 230. In embodiments, etch-stop layer 240 is formed of an oxide material or an oxynitride material.

Etch-stop layer 240 has a thickness 242 which, in embodiments, is between fifty nanometers and three hundred nanometers.

In embodiments, semiconductor substrate 210 includes a two-dimensional array of photodiode regions 212, where respective directions of rows and columns of the two-dimensional array define respective directions of axes 298Y and 298X. Adjacent photodiode regions 212 are separated by a pixel-pitch 214 in each of the x and y directions. In embodiments, each photodiode region 212 is part of a respective pixel of a small-pixel array formed in semiconductor substrate 210.

FIG. 2 denotes a surface-region 227 of back surface 220 between adjacent photodiode regions 212. Semiconductor substrate 210 has a first thickness 216 between front surface 211 and surface-region 228 and a second thickness 217 between front surface 211 and surface-region 227. In embodiments, first thickness 216 is less than or equal to second thickness 217. For example, thickness 217 may exceed thickness 216 by a sum of respective thicknesses 232, 242, 252, and 262 of layers 230, 240, 250, and 260. In embodiments, thickness 262 equals a difference between thickness 217 and thickness 216.

Passivation layer 230, etch-stop layer 240, and adhesion layer 250, and metal layer 260 have respective top surfaces 239, 249, 259, and 269. In embodiments of pixel-array substrate 200 when first thickness 216 is less than second thickness 217, top surface 269 (upper surface) of metal layer 260 is coplanar with at least one of top surfaces 239, 249, and 259, as illustrated in FIG. 2. In embodiments, top surface 269 of metal layer 260 is coplanar top surface 249 of etch-stop layer 240. Adhesion layer 250 has a bottom surface 251. In embodiments of pixel-array substrate 200 when first thickness 216 equals second thickness 217, part of bottom surface 251 above photodiode region 212 is coplanar with at least one of top surfaces 239 and 249.

In embodiments, semiconductor substrate 210 includes a plurality of a large-photodiode regions 213, one of which is shown in each of FIGS. 2 and 3. Each large-photodiode region 213 is between a respective pair of adjacent small photodiode regions 212. Restated, each of small photodiode regions 212 is arranged to be surrounded by adjacent large-photodiode regions 213. The plurality of small photodiode regions 212 and large-photodiode regions 213 form a two-dimensional array. In embodiments, each small photodiode region 212 and adjacent large-photodiode region 213 is part of a respective pixel of a large-pixel array formed in semiconductor substrate 210, where the large-pixel array is interleaved with the small-pixel array that includes the two-dimensional array of photodiode regions 212. In embodiments, each small photodiode regions 212 has a smaller full well capacity than each large-photodiode region 213. In embodiments, large-photodiode region 213 is surrounded by a deep-trench isolation structure in the cross-sectional plane of FIG. 3.

Trench 221 has a width 223 and a depth 225 in the horizontal and vertical directions, respectively. Width 223 may be between 0.10 micrometers and 0.25 micrometers. Depth 225 is with respect to back-surface region 227. In embodiments, thickness 217 exceeds depth 225 by between 0.5 micrometers and 2.0 micrometers to ensure sufficient electrical isolation. In embodiments, trenches 221 function as a deep trench isolation structures in semiconductor substrate 210.

Figure 4:
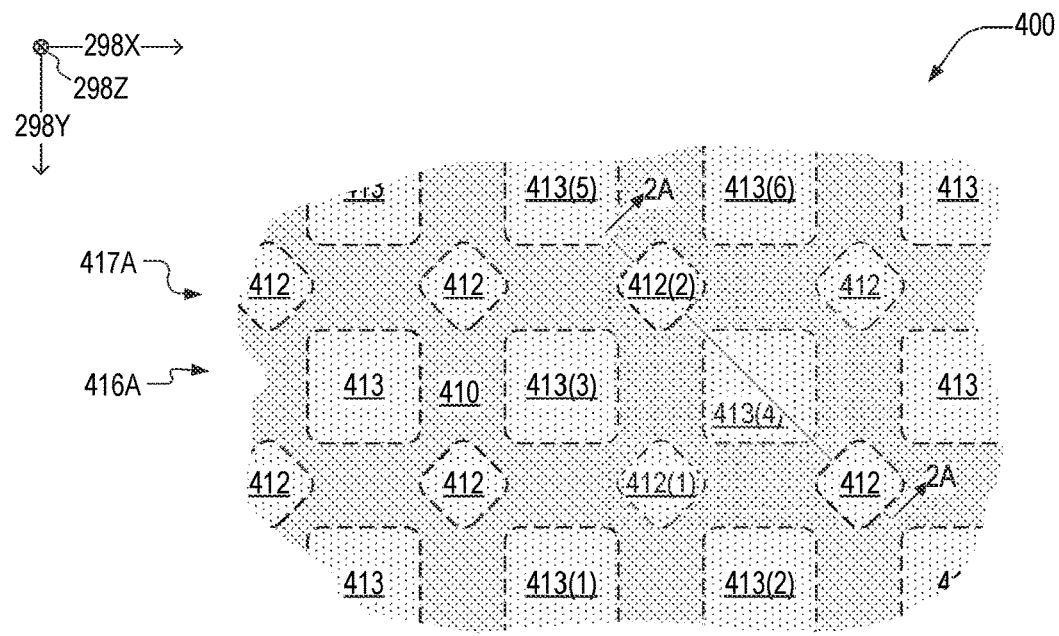
FIG. 4 is a schematic of a pixel-array substrate, which is an example of the pixel-array substrate of FIG. 2, in an embodiment.

FIG. 4 is a cross-sectional schematic of a pixel-array substrate 400, which is an example of pixel-array substrate 200. The cross-sectional view of FIG. 4 is in cross-sectional plane 3A shown in FIG. 2. FIG. 4 denotes a cross-section 2A, which is an example of the cross-sectional plane of FIG. 2. Pixel-array substrate 400 includes a plurality of small-photodiode regions 412 and a plurality of large-photodiode regions 413, which are respective examples of small-photodiode regions 212 and a plurality of large-photodiode regions 213. Each small-photodiode region is located at a center of a respective two-by-two array of large-photodiode regions 413. For example, small-photodiode region 412(1) is located at a center of a two-by-two array of large-photodiode regions 413(1-4), and small-photodiode region 412(2) is located at a center of a two-by-two array of large-photodiode regions 413(3-6).

In embodiments, each of the large-photodiode region 413 is located adjacent to a small-photodiode region 412 and surrounds the respective small-photodiode region 412. For example, small-photodiode region 412(2) is surrounded by large-photodiode regions 413(3), 413(4), 413(5), and 413(6). Each small-photodiode region 412 is electrically and optically isolated from large-photodiode regions 413 adjacent thereto by a deep trench isolation structure, wherein the deep trench isolation structure includes of passivation layer 230, etch-stop layer 240, adhesion layer 250, and metal layer 260.

In embodiments, each small-photodiode region 412 is part of a respective pixel of a small-pixel array 416A formed in a semiconductor substrate 410 and each large-photodiode region 413 is part of a respective pixel of a large-pixel array 417A formed in semiconductor substrate 410. Pixel-array substrate 400 is an example of pixel-array substrate 100, such that, in embodiments, pixel-array 112A includes both small-pixel array 416A and large-pixel array 417A. Semiconductor substrate 410 is an example of semiconductor substrate 210.

Figure 5:
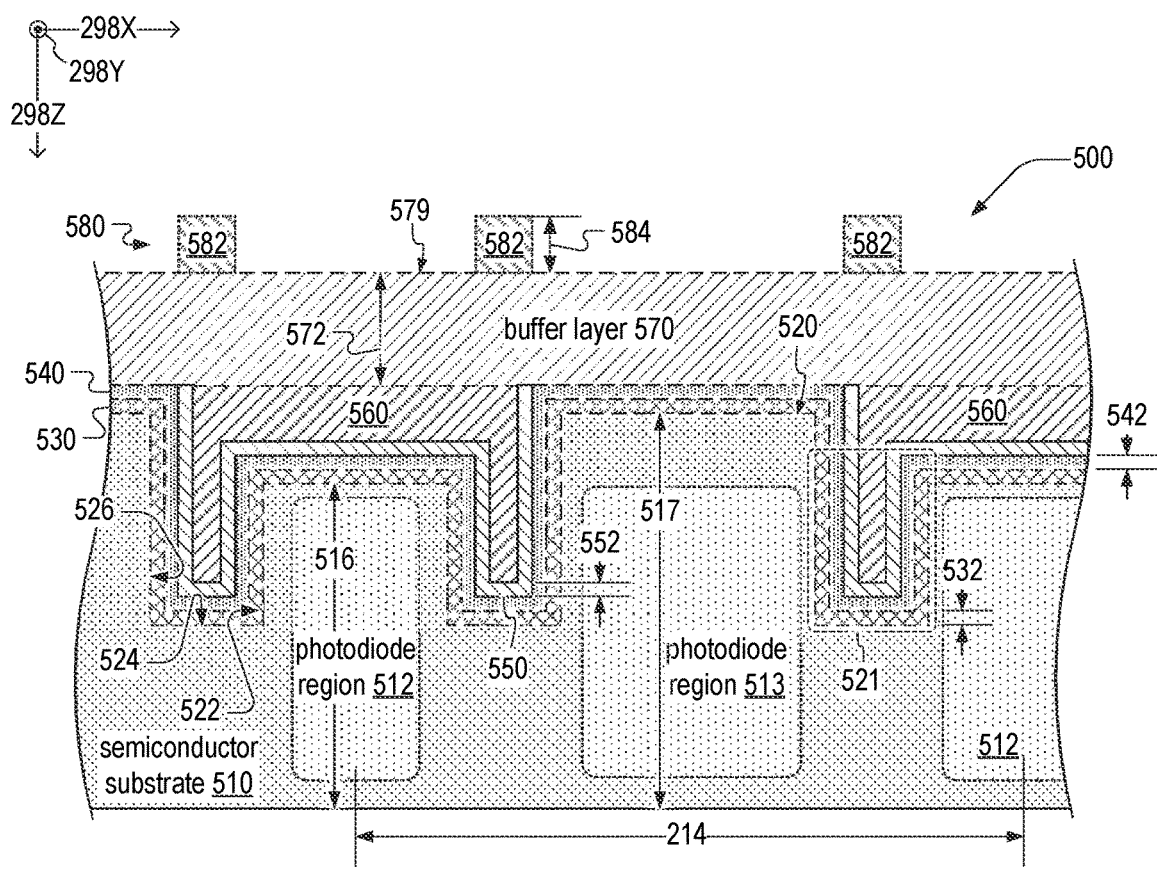
FIG. 5 is a schematic of a first embodiment of the flicker-mitigating pixel-array substrate of FIG. 4.

FIG. 5 is a cross-sectional schematic of a flicker-mitigating pixel-array substrate 500, which is example of pixel-array substrate 400. Pixel-array substrate 500 includes a semiconductor substrate 510, which has thicknesses 516 and 517. Semiconductor substrate 510 and thicknesses 516 and 517 are respective examples of semiconductor substrate 210 and thicknesses 216 and 217 of pixel-array substrate 200, FIG. 2. Thickness 517 exceeds thickness 516. Semiconductor substrate 510 includes a plurality of small photodiode regions 512 and a plurality of large-photodiode regions 513 surrounding each of the small photodiode regions 512, which are respective examples of small photodiode regions 212 and large-photodiode regions 213. Semiconductor substrate 510 has a back surface 520, which is an example of back surface 220, and hence includes surface-regions 522, 524, and 526, which are respective examples of surface-regions 222, 224, and 226. Surface-regions 522, 524, and 526 define a trench 521, which is an example of trench 221. Back surface 520 also includes analogs of other surface regions of back surface 220, such as surface-regions 227 and 228.

In embodiments, pixel-array substrate 500 includes a buffer layer 570 above each small photodiode region 512 and each of large-photodiode region 513. Buffer layer 570 has a uniform thickness 572 and may be formed of an oxide. In embodiments, thickness 572 is between 0.1 micrometers and 0.3 micrometers.

In embodiments, pixel-array substrate 500 includes a plurality of deep trench isolation structures, formed in respective trenches 521, interconnecting to each other and forming in a grid form surrounding each of small photodiode regions 512 and each of large-photodiode regions 513 providing isolation therebetween.

In embodiments, pixel-array substrate 500 includes at least one of a passivation layer 530, an etch-stop layer 540, and an adhesion layer 550, which are respective examples of a passivation layer 230, an etch-stop layer 240, and an adhesion layer 250. Each deep trench isolation structures includes passivation layer 530, etch-stop layer 540, and adhesion layer 550, and metal layer 560 deposited. Layers 530, 540, 550, 560 have respective thicknesses 532, 542, 552, and 562, which are respective examples of thicknesses 232, 242, 252, and 262. Thickness 517 exceeds thickness 516 by a sum of respective thicknesses 532, 542, 552, and 562.

In embodiments, pixel-array substrate 500 includes a metal grid 580 on a top surface 579 of buffer layer 570. Metal grid 580 includes a plurality of metal segments 582 interconnected in a grid form, such that each metal segment 582 is aligned above a respective deep trench isolation structure and surrounds photodiode regions 212, 213 defining apertures above photodiode regions 212, 213. Metal grid 580 may absorb and/or reflect incident light such that incident light directed, for example by microlenses, to photodiode region 212 or 213 stay within the respective photodiode regions 212 or 213, thereby reducing optical cross-talk between adjacent photodiode regions 212, 213. Metal grid 580 may be formed of a metal, such as tungsten. In embodiments, metal grid 580 may be formed of a stack of dielectric and metal material. In embodiments, pixel-array substrate includes a plurality of microlenses in a layer above the metal grid 580.

In direction 298Z, each of metal segments 582 has a thickness 584 which, in embodiments, exceeds an intensity penetration depth δ at free-space electromagnetic wavelength $\lambda_0$, $\delta = \lambda_0/(\pi n_i)$, where $n_i$ is the imaginary part of metal segment 582's refractive index at wavelength $\lambda_0$. Wavelength $\lambda_0$ may be between 0.4 micrometers and 1.0 micrometers. In embodiments, thickness 584 is between 75 and 125 nanometers.

Figure 6:
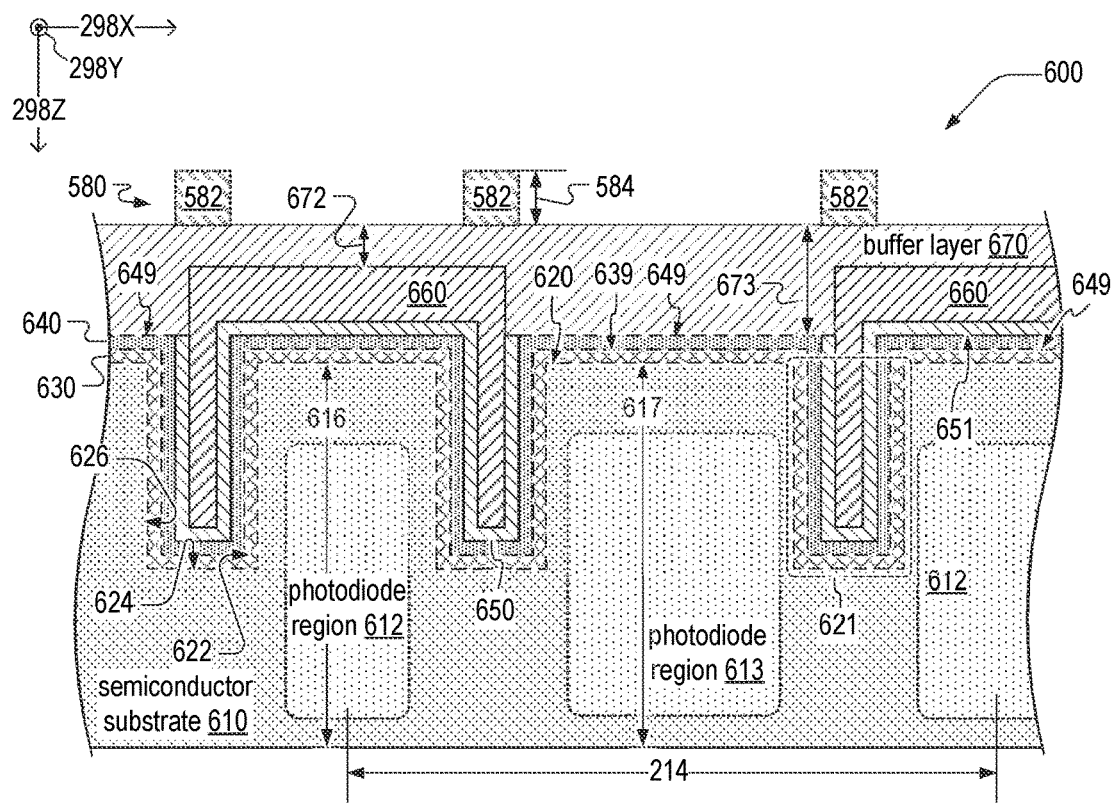
FIG. 6 is a schematic of a second embodiment of the flicker-mitigating pixel-array substrate of FIG. 4.

FIG. 6 is a cross-sectional schematic of a flicker-mitigating pixel-array substrate 600, which is an example of pixel-array substrate 400. In embodiments, pixel-array substrate 600 includes a buffer layer 670 above each small-photodiode region 612 and each large-photodiode region 613. Semiconductor substrate 610 has a back surface 620, which is an example of back surface 220, and hence includes surface-regions 622, 624, and 626, which are respective examples of surface-regions 222, 224, and 226 and form a trench 621, which is an example of trench 221. Back surface 620 also includes analogs of other surface regions of back surface 220, such as surface-regions 227 and 228.

Pixel-array substrate 600 includes a semiconductor substrate 610 and a metal layer 660, which are respective examples of semiconductor substrate 210 and a metal layer 260 of pixel-array substrate 200, FIG. 2. Semiconductor substrate 610 includes a plurality of small photodiode regions 612 and a plurality of large-photodiode regions 613, which are respective examples of small photo-diode regions 212 and large-photodiode regions 213. As illustrated in FIG. 6, metal layer 660 is formed above back surface 620 of semiconductor substrate 610 and covers a light exposure area of the small photodiode region 612 completely. Metal layer 660 is embedded in buffer layer 670. Metal layer 660 may have a material thickness between 0.1 micrometers to 0.3 micrometers, and depends on material chosen and amount of light transmittance needed.

Semiconductor substrate 610 has thicknesses 616 and 617, which are respective examples of thicknesses 216 and 217 of pixel-array substrate 200, FIG. 2. In embodiments, thickness 617 equals thickness 616. In embodiments, pixel-array substrate 600 includes at least one of a passivation layer 630, an etch-stop layer 640, and an adhesion layer 650, which are respective examples of a passivation layer 230, an etch-stop layer 240, and an adhesion layer 250.

Semiconductor substrate 610 includes a plurality of deep trench isolation structures formed therein, wherein the plurality of deep trench isolation structures interconnecting to each other and forming in a grid form surrounding each of small photodiode regions 612 providing isolation between each of small photodiode regions 612 and adjacent large-photodiode regions 613. Each of deep trench isolation structures includes a trench 621 having passivation layer 630, an etch-stop layer 640, and an adhesion layer 650, and metal layer 660 deposited, respectively.

Passivation layer 630 and etch-stop layer 640 have respective top surfaces 639 and 649, which are respective examples of top surfaces 239 and 249. Adhesion layer 650 has a bottom surface 651, which is an example of bottom surface 251 of adhesion layer 250. When pixel-array substrate 600 includes etch-stop layer 640, bottom surface 651 may be coplanar with top surface 649. When pixel-array substrate 600 includes passivation layer 630, and does not include etch-stop layer 640, bottom surface 651 may be coplanar with top surface 639. Adhesion layer 650 covers the surface-region located (e.g., the light exposure area) above small photodiode region 612 while not covering a surface-region (e.g., the light exposure area) above large photodiode region 613.

In embodiments, pixel-array substrate 600 includes metal grid 580 formed on buffer layer 670. Each metal segment 582 of metal grid 580 is aligned with respective trench 621, and structured to define an aperture or opening above small-photodiode region 612 and/or large-photodiode region 613. In embodiments, each metal segment 582 is aligned to a respective trench 621 that surrounds a respective small-photodiode region 612. In embodiments, passivation layer 630, etch-stop layer 640, and adhesion layer 650, and metal layer 660 form a deep trench isolation structure in trench 621.

Buffer layer 670 has a thickness 672 above photodiode regions 212 and a thickness 673 above photodiode regions 213. Thickness 673 exceeds thickness 672. In embodiments, thickness 672 is between 0.1 micrometers and 0.3 micrometers. Buffer layer 670 may be formed of an oxide material.

Figure 7:
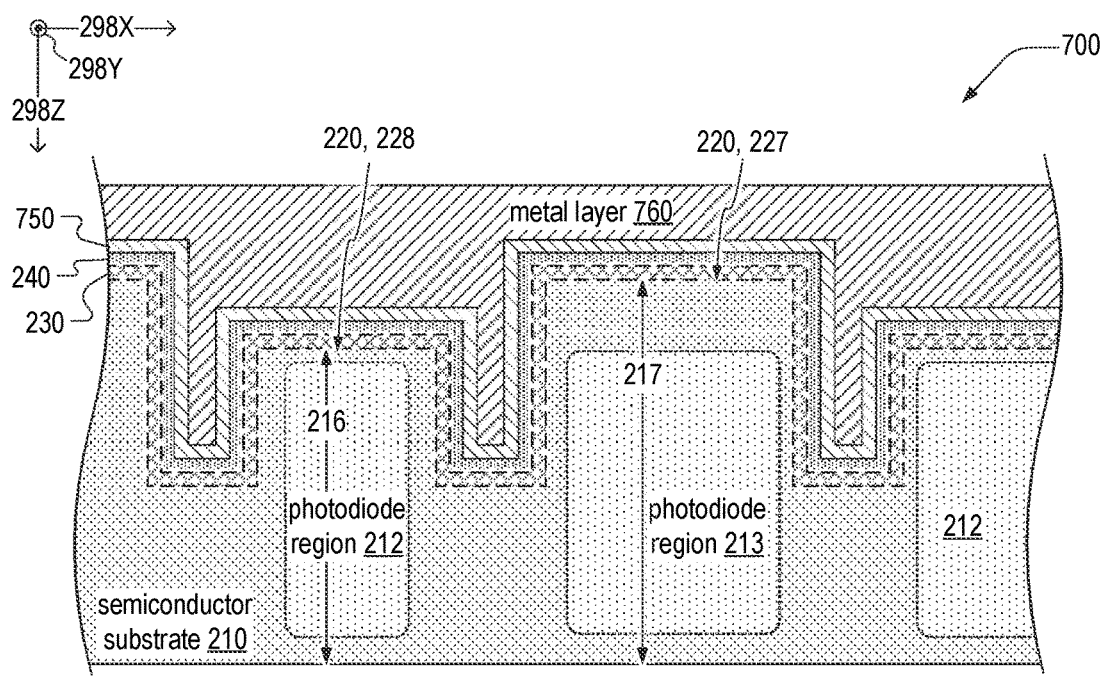
FIG. 7 is a cross-sectional schematic of a precursor to the pixel-array substrate of FIG. 2 before formation of metal layers thereon, in an embodiment.

FIG. 7 is a cross-sectional schematic of a pixel-array substrate 700, which is precursor to pixel-array substrate 200 before formation of metal layers 260 thereon. Pixel-array substrate 700 includes semiconductor substrate 210 and at least one of layers 230 240, and an adhesion layer 750. Adhesion layer 750 is an example of adhesion layer 250 that is above both photodiode regions 212 and 213. Pixel-array substrate 700 also includes a metal layer 760 above each of the plurality of photodiode regions 212 and 213. In embodiments, metal layer 760 is deposited into a region of trench 621 located above small-photodiode region 612. In embodiments, metal layer 760 is planarized to yield metal layers 560. In embodiments, metal layer 760 is etched to yield metal layers 660.

Figure 8:
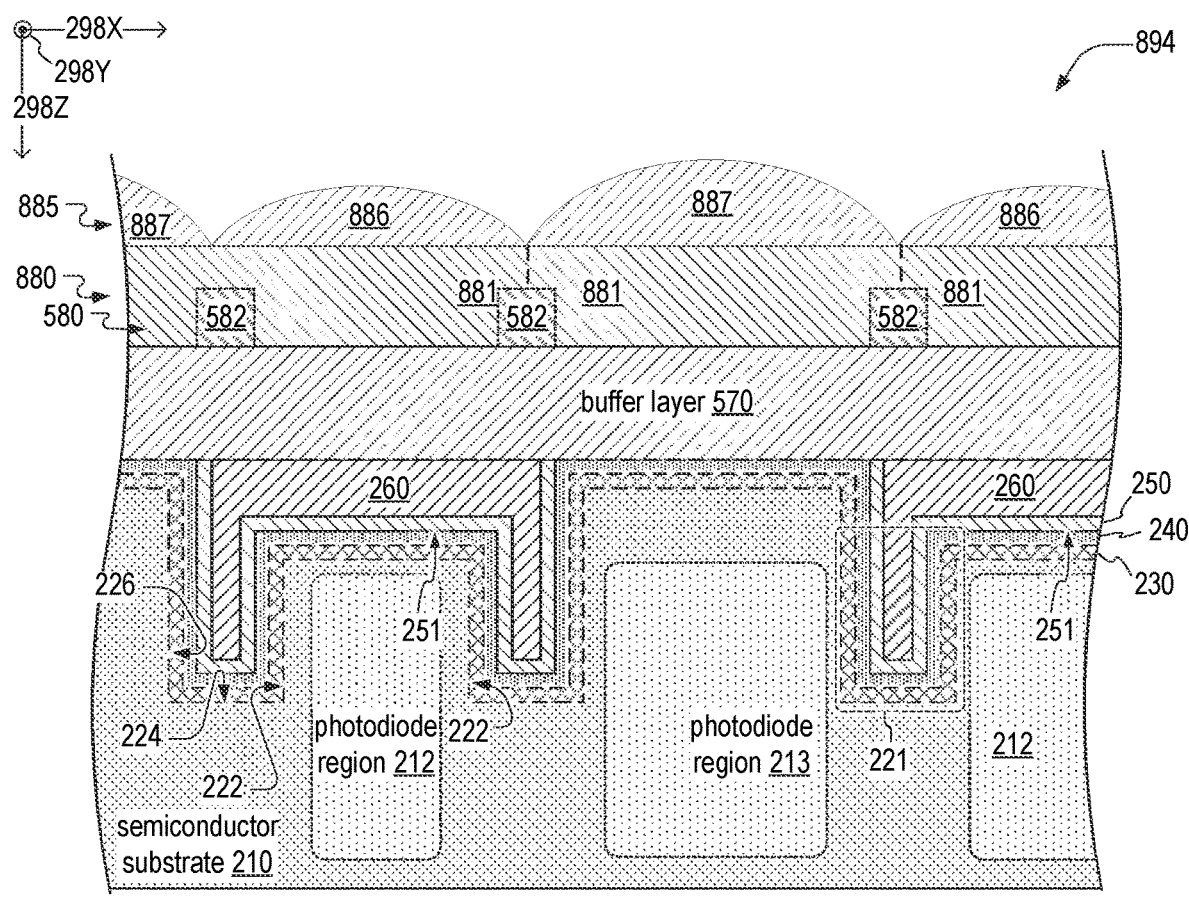
FIG. 8 is a schematic cross-sectional view of a first image sensor, which is an example of the image sensor of FIG. 1.

FIG. 8 is a schematic cross-sectional view of an image sensor 894, which is an example of image sensor 194 of camera 190, FIG. 1. Image sensor 894 includes pixel-array substrate 200, buffer layer 570, a color filter array 880, metal grid 580, and a microlens array 885. Metal grid 580 is on top surface 579 of buffer layer 570 and is embedded in color filter array 880.

Microlens array 885 includes (i) a plurality of microlenses 886 each aligned to a respective photodiode region 212 for directing light thereto, and (ii) a plurality of microlenses 887 each aligned to a respective photodiode region 213 for directing light thereto. In embodiments, microlens 887 is thicker than microlens 886. Color filter array 880 is between microlens array 885 and back surface 220, and includes a plurality of color filters 881. Each color filter 881 is disposed on metal grid 580 and into the apertures defined by metal grid 580. Each color filter 881 is aligned to respective photodiode region 212 or 213 for spectrally filtering light transmitted through a microlens 886 or microlens 887 aligned thereto.

Accordingly, incident light that reaches a small photodiode region 212 has been transmitted through a respective metal layer 260 on the first back surface region while incident light that reaches a large-photodiode region 213 does not pass through a metal layer 260. As such, the intensity of incident light directed to small photodiode region 212 is attenuated to attain desired quantum efficiency and reducing crosstalk between small photodiode region 212 and adjacent large photodiode sections 213, without affecting the light intensity of incident light directed to large-photodiode region 213.

Figure 9:
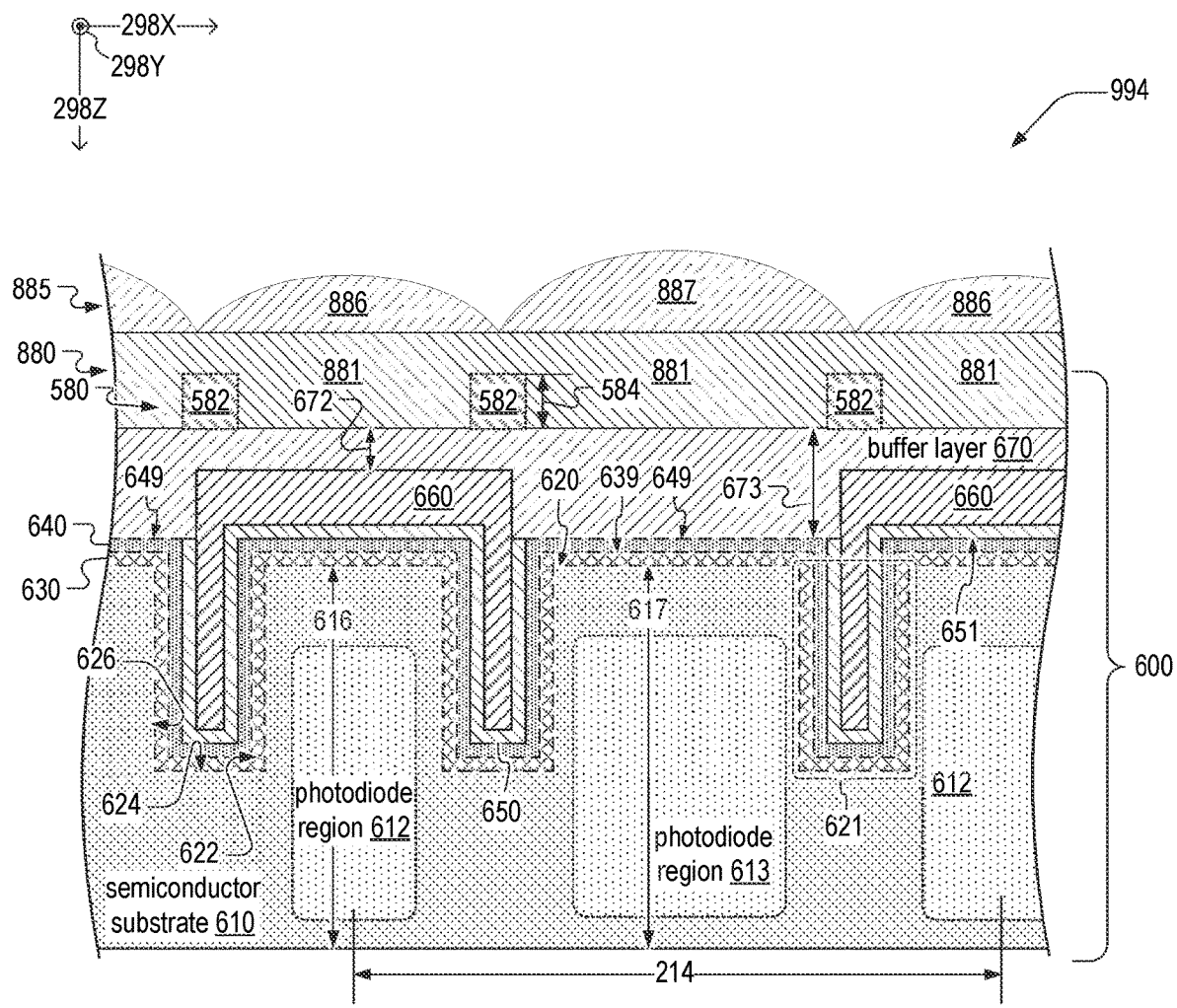
FIG. 9 is a schematic cross-sectional view of a second image sensor, which is an example of the image sensor of FIG. 1.

FIG. 9 is a schematic cross-sectional view of an image sensor 994, which is an example of image sensor 194 of camera 190, FIG. 1. Image sensor 994 includes pixel-array substrate 900 with color filter array 880 and microlens array 885 thereon. Each color filter 881 is aligned to respective photodiode region 612 or 613 for spectrally filtering light transmitted through a microlens 886 or microlens 887 aligned thereto. Each microlens 886 is aligned to a respective photodiode region 612 for directing light thereto. Each microlens 887 is aligned to a respective photodiode region 613 for directing light thereto.

Figure 10:
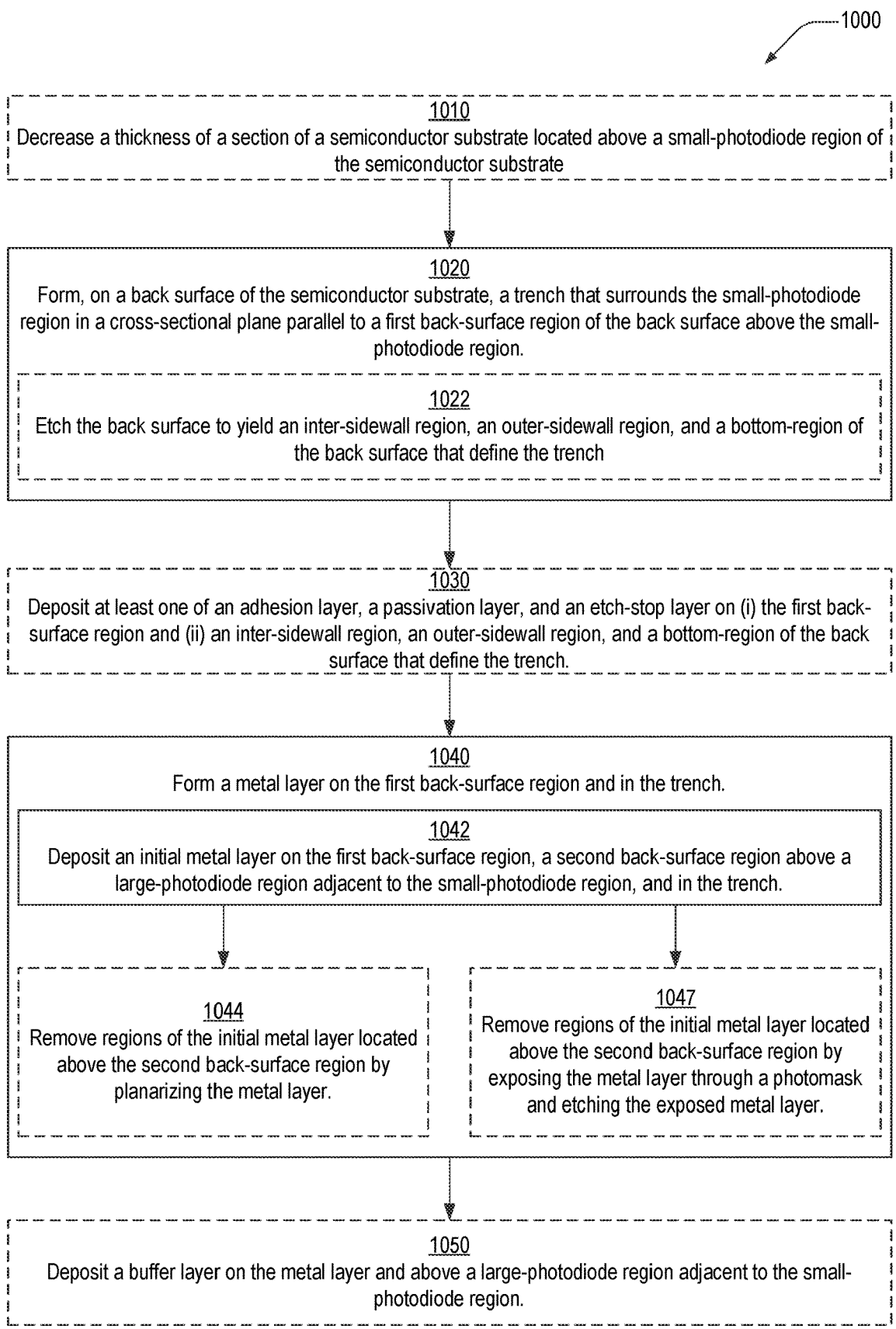
FIG. 10 is a flowchart illustrating a method for fabricating a flicker-mitigating pixel-array substrate, in an embodiment.

FIG. 10 is a flowchart illustrating a method 1000 for fabricating a flicker-mitigating pixel-array substrate. Method 1000 includes step 1040. In embodiments, method 1000 also includes at least one of steps 1010, 1020, 1030, and 1050.

Step 1010 includes decreasing a thickness of a section of a semiconductor substrate from a back surface of the semiconductor substrate that located above small-photodiode region formed in the semiconductor substrate. In embodiments, step 1010 and subsequent steps apply to additional sections of a semiconductor substrate corresponding to a respective one of a plurality of small-photodiode regions formed in the semiconductor substrate.

In an example of step 1010, a precursor substrate to semiconductor substrate 510 FIG. 5, has a uniform thickness 517 and hence lacks any trenches and lacks surface-regions 522, 524, and 526. In embodiments, this precursor substrate is semi-fabricated e.g., after front-end process that may include forming a plurality of large and small photodiode regions, transistor gates and associated sources and drains. This precursor substrate is masked and etched such that regions thereof that include small photodiode regions 512 have a thickness 516 that is less than thickness 517.

Step 1020 includes forming, on the back surface of the semiconductor substrate, a trench that surrounds the small-photodiode region in a cross-sectional plane parallel to a first back-surface region of the back surface above the small-photodiode region. In a first example of step 1020, trench 221 is formed on back surface 220 of semiconductor substrate 210, FIG. 2 In a second example of step 1020, trenches 314(1), 314(2), 315(1), and 315(2), FIG. 3, are formed on back surface 220.

In embodiments, step 1020 includes a step 1022, which includes etching the back surface to yield an inner-sidewall region, an outer-sidewall region, and a bottom-region of the back surface that define the trench. In an example of step 1022, back surface 220 of semiconductor substrate 210 is etched to yield inner-sidewall surface-region 222, outer-sidewall surface-region 226, and bottom surface-region 224 of back surface 220 that define trench 221. Step 1022 may also include etching the back surface to yield a surface-region, such as surface-region 228, above the small photodiode region.

Step 1030 includes depositing at least one of an adhesion layer, a passivation layer, and an etch-stop layer on (i) the first back-surface region and (ii) the inner-sidewall region, the outer-sidewall region, and the bottom-region of the back surface that define the trench. Step 1030 may also include depositing at least one of an adhesion layer, a passivation layer, and an etch-stop layer on the surface-region above small photodiode region. In an example of step 1030 at least one of passivation layer 230, an etch-stop layer 240, and an adhesion layer 250 is deposited on back surface 220. In an example of 1030, deposition of adhesion layer 250 follows deposition of etch-stop layer 240, which follows deposition of passivation layer 230.

Step 1040 includes forming a metal layer on the first back-surface region and in the trench. In embodiments, the metal layer formed on the first back-surface region is coplanar with a top surface of the etch-stop layer deposited on back surface above the adjacent large photodiode region. In an example of step 1040, metal layer 260 is formed on back-surface regions 228 and in trenches 221. In embodiments, top surface 269 of metal layer 260 is coplanar with top surface 249 of etch-stop layer 240.

Step 1040 may include step 1042. Step 1042 includes depositing an initial metal layer on the first back-surface region, a second back-surface region above a large-photodiode region adjacent to the small-photodiode region, and in the trench. In an example of step 1042, metal layer 760 is deposited on back-surface regions 227 and 228, and in trench 221 of pixel-array substrate 700, FIG. 7.

When method 1000 results in pixel-array substrate 500, step 1040 may include step 1044. Step 1040 may include step 1044 when the semiconductor substrate has (i) a first thickness between the first back-surface region and planar front surface opposite the back surface and (ii) between the planar front surface and the second back-surface region, a second thickness that exceeds the first thickness. An example of such a semiconductor substrate is semiconductor substrate 210 when thickness 217 exceeds thickness 216, as in semiconductor substrate 510, FIG. 5.

Step 1044 includes removing regions of the initial metal layer located on the second back-surface regions by planarizing the metal layer. In embodiments, planarization is achieved via an etching or a chemical mechanical polishing (CMP) process. The planarization process self-stops at the etch stop layer. As such, the portion of metal layer 760 on the second back-surface regions above each of large photodiode region is removed while leaving portion of metal layer 760 on the first back-surface regions above each of small photodiode regions, wherein the remaining portion of metal layer 760 covers the light exposure area of each of the small photodiode regions. In an example of step 1044, portions of metal layer 760 located above large-photodiode regions 213 are removed by planarizing metal layer 760 while portions of metal layer 760 located above small photodiode regions 212 remain. Step 1044 may also include removing portions of an adhesion layer above large photodiode regions. For example, step 1044 may include removing portions of adhesion layer 750 above large-photodiode regions 213 to yield at least one adhesion layer 250.

Step 1040 may include step 1047 when the semiconductor substrate has a uniform thickness, for example, when thicknesses 216 and 217 are equal, as in semiconductor substrate 610, FIG. 6. Accordingly, in embodiments method 1000 includes step 1047 while not including step 1010. Step 1047 includes removing regions of the initial metal layer located above the second back-surface region by exposing the metal layer through a photomask and etching the exposed metal layer. In an example of step 1047, regions of metal layer 760 located above back-surface regions 227 are removed by exposing metal layer 760 through a patterned photomask and then etching metal layer 760, accordingly.

Step 1050 includes depositing a buffer layer on the metal layer and above a large-photodiode region adjacent to the small-photodiode region. In a first example of step 1050, buffer layer 570 is deposited on metal layer 560 and above large-photodiode region 513, FIG. 5. In a second example of step 1050, buffer layer 670 is deposited on metal layer 660 and above large-photodiode region 613, FIG. 6, which results in metal layer 660 being embedded in buffer layer 670.

In embodiments, after step 1050, method 1000 includes steps of metal deposition, patterning, and etching to form a plurality of interconnected metal segments forming a metal grid on the buffer layer enclosing light exposure area of respective large and small photodiode regions. Color filter material may be deposited in between the metal segments thereafter to form a plurality of color filters for each of the large and small photodiode regions. A process for forming a microlens array may be performed after formation of color filters.

Combinations of Features

Features described above as well as those claimed below may be combined in various ways without departing from the scope hereof. The following enumerated examples illustrate some possible, non-limiting combinations.

(A1) A flicker-mitigating pixel-array substrate includes a semiconductor substrate and a metal layer. The semiconductor substrate includes a small-photodiode region. A back surface of the semiconductor substrate forms a trench surrounding the small-photodiode region in a cross-sectional plane parallel to a first back-surface region of the back surface above the small-photodiode region. The metal layer covers the first back-surface region, at least partially fills the trench, and surrounds the small-photodiode region in the cross-sectional plane.

(A2) In embodiments of pixel-array substrate (A1), a thickness of the metal layer above the first back-surface region is between 0.1 micrometers and 0.3 micrometers.

(A3) In embodiments of either one of pixel-array substrate (A1) and (A2), materials forming the metal layer include at least one of tungsten and aluminum.

(A4) Embodiments of any one of pixel-array substrates (A1)-(A3) further include an adhesion layer covering the first back-surface region and extending into the trench between (i) the metal layer and an inner-sidewall region of the back surface and between (ii) the metal layer and an outer-sidewall region of the back surface.

(A5) In embodiments of pixel-array substrate (A4), a thickness of the adhesion layer above the first back-surface region is between twenty nanometers and fifty nanometers.

(A6) In embodiments of any one of pixel-array substrates (A1)-(A5), the semiconductor substrate further includes four large-photodiode regions forming a two-by-two array. The small-photodiode region is located at a center of the two-by-two array.

(A7) In embodiments of pixel-array substrate (A6), the four large-photodiode regions include a first, a second, a third, and a fourth large-photodiode region, the semiconductor substrate further includes an additional small-photodiode region, the semiconductor substrate further includes a fifth large-photodiode region and a sixth large-photodiode region that, with the third and fourth large-photodiode regions, form an additional two-by-two array. The additional small-photodiode region is located at a center of the additional two-by-two array.

(A8) In embodiments of pixel-array substrate (A6) and (A7), the semiconductor substrate has (i) a first thickness between the first back-surface region and planar front surface opposite the back surface and (ii) between the planar front surface and a second back-surface region above one of the four large-photodiode regions, a second thickness that exceeds the first thickness.

(A9) In embodiments of any one of pixel-array substrates (A6)-(A8), the back surface of the semiconductor substrate includes four coplanar surface-regions each located above a respective one of the four large-photodiode regions. A top surface of the metal layer above the small-photodiode region is coplanar with one of (i) the four coplanar surface-regions, (ii) a passivation layer formed on each of the four coplanar surface-regions, and (iii) an etch-stop layer formed on each of the four coplanar surface-regions.

(A10) Embodiments of any one of pixel-array substrates (A6)-(A9) further include a passivation layer between the metal layer and the semiconductor substrate and covering the first back-surface region and the back surface above each of the four large-photodiode regions.

(A11) Embodiments of pixel-array substrate] (A10) further includes an etch-stop layer between the metal layer and the passivation layer. The etch-stop layer may cover the passivation layer above each of the four large-photodiode regions. A top surface of the metal layer above the small-photodiode region may be coplanar with a top surface of the etch-stop layer located above each of the four large-photodiode regions.

(A12) Embodiments of pixel-array substrate (A11) further include a buffer layer located above the first back-surface region and each of the four large-photodiode regions. The metal layer is between the first back-surface region and the buffer layer.

(A13) In embodiments of pixel-array substrate (A12), the buffer layer has (i) a first thickness above the small-photodiode region, and (ii) a second thickness above each of the four large-photodiode regions that exceeds the first thickness.

(A14) In embodiments of pixel-array substrate (A12), the buffer layer has a (i) first thickness above the small-photodiode region, and (ii) a second thickness above each of the four large-photodiode regions that equals the first thickness.

(A15) Embodiments of any one of pixel-array substrates (A12)-(A14) further include a metal grid on the buffer layer, aligned with the trench, and forming an aperture above the small-photodiode region.

(B1) A method for fabricating a flicker-mitigating pixel-array substrate includes forming a metal layer (i) in a trench that surrounds a small-photodiode region of a semiconductor substrate in a cross-sectional plane parallel to a first back-surface region of the back surface above the small-photodiode region and (ii) on the first back-surface region.

(B2) In embodiments of method (B1), forming the trench includes etching the back surface to yield an inner-sidewall region, an outer-sidewall region, and a bottom-region of the back surface that define the trench.

(B3) Embodiments of either one of methods (B1) and (B2) further include, before forming the metal layer, depositing at least one of an adhesion layer, a passivation layer, and an etch-stop layer on (i) the first back-surface region and (ii) an inner-sidewall region, an outer-sidewall region, and a bottom-region of the back surface that define the trench.

(B4) Embodiments of any one of methods (B1)-(B3) further include depositing a buffer layer on the metal layer and above a large-photodiode region adjacent to the small-photodiode region. Depositing the buffer layer may include embedding the metal layer in the buffer layer.

(B5) In embodiments of any one of methods (B1)-(B4), the semiconductor substrate has (i) a first thickness between the first back-surface region and planar front surface opposite the back surface and (ii) between the planar front surface and a second back-surface region above a large-photodiode region adjacent to the small-photodiode region, a second thickness that exceeds the first thickness. In such embodiments, forming the metal layer may include depositing an initial metal layer on the first and second back-surface regions and in the trench; and removing regions of the initial metal layer located above the second back-surface region by planarizing the metal layer.

(B6) In embodiments of any one of methods (B1)-(B4), forming the metal layer includes: depositing an initial metal layer on the first back-surface region, a second back-surface region above a large-photodiode region adjacent to the small-photodiode region, and in the trench; and removing regions of the initial metal layer located above the second back-surface region by exposing the metal layer through a photomask and etching the exposed metal layer.

(B7) Embodiments of any one of methods (B1)-(B6) further includes forming the trench.

(B8) In embodiments of method (B7), forming the trench includes etching the back surface to yield an inner-sidewall region, an outer-sidewall region, and a bottom-region of the back surface that define the trench.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A flicker-mitigating pixel-array substrate comprising:
a semiconductor substrate including a small-photodiode region and a large-photodiode region, a back surface of the semiconductor substrate forming a trench surrounding the small-photodiode region and separating the small-photodiode region from the large-photodiode region in a cross-sectional plane parallel to a first back-surface region of the back surface between a first microlens and the small-photodiode region;
a metal layer that (i) at least partially fills the trench, (ii) surrounds the small-photodiode region in the cross-sectional plane, and (iii) includes a layer-region located between the first microlens and the small-photodiode region;
a first color filter between the first microlens and the small-photodiode region; and
a second color filter between a second microlens and the large-photodiode region;
wherein the semiconductor substrate has (i) a first thickness between the first back-surface region and the first color filter and (ii) between a second back-surface region located between the second color filter and the large-photodiode region and the second color filter, a second thickness that exceeds the first thickness.

2. The pixel-array substrate of claim 1, a thickness of the metal layer above the first back-surface region being between 0.1 micrometers and 0.3 micrometers.

3. The pixel-array substrate of claim 1, further comprising an adhesion layer covering the first back-surface region and extending into the trench between (i) the metal layer and an inner-sidewall region of the back surface and between (ii) the metal layer and an outer-sidewall region of the back surface.

4. The pixel-array substrate of claim 1, the semiconductor substrate further including four large-photodiode regions forming a two-by-two array, the small-photodiode region being located at a center of the two-by-two array.

5. The pixel-array substrate of claim 4, the back surface of the semiconductor substrate including four coplanar surface-regions each located above a respective one of the four large-photodiode regions, a top surface of the metal layer above the small-photodiode region being coplanar with one of (i) the four coplanar surface-regions, (ii) a passivation layer formed on each of the four coplanar surface-regions, and (iii) an etch-stop layer formed on each of the four coplanar surface-regions.

6. The pixel-array substrate of claim 4, the four large-photodiode regions including a first, a second, a third, and a fourth large-photodiode region, the semiconductor substrate further including an additional small-photodiode region, the semiconductor substrate further including a fifth large-photodiode region and a sixth large-photodiode region that, with the third and fourth large-photodiode regions, form an additional two-by-two array, the additional small-photodiode region being located at a center of the additional two-by-two array.

7. The pixel-array substrate of claim 1, in an additional cross-sectional plane perpendicular to the cross-sectional plane and intersecting the small-photodiode region, a width of the layer-region exceeds a width of the small-photodiode region.

8. The pixel-array substrate of claim 1, no part of the layer-region being between the second microlens and the large-photodiode region.

9. A flicker-mitigating pixel-array substrate comprising:
a semiconductor substrate including a small-photodiode region and a large-photodiode region, a back surface of the semiconductor substrate forming a trench surrounding the small-photodiode region and separating the small-photodiode region from the large-photodiode region in a cross-sectional plane parallel to a first back-surface region of the back surface between a microlens and the small-photodiode region;
a metal layer that (i) at least partially fills the trench, (ii) surrounds the small-photodiode region in the cross-sectional plane, and (iii) includes a layer-region located between the microlens and the small-photodiode region;

a passivation layer between the metal layer and the semiconductor substrate and covering the first back-surface region and the back surface above the large-photodiode region; and an etch-stop layer between the metal layer and the passivation layer.

10. The pixel-array of claim 9, the etch-stop layer covering the passivation layer above the large-photodiode region, a top surface of the metal layer above the small-photodiode region being coplanar with a top surface of the etch-stop layer located above the large-photodiode region.

11. The pixel-array substrate of claim 9, further comprising a buffer layer located above the first back-surface region and the large-photodiode region, the metal layer being between the first back-surface region and the buffer layer.

12. The pixel-array substrate of claim 11, the buffer layer having a first thickness above the small-photodiode region, and having a second thickness above the large-photodiode region that exceeds the first thickness.

13. A method for fabricating a flicker-mitigating pixel-array substrate comprising:

forming a metal layer (i) in a trench that surrounds a small-photodiode region of a semiconductor substrate in a cross-sectional plane parallel to a first back-surface region, of a back surface of the semiconductor substrate, above the small-photodiode region and (ii) on the first back-surface region;

the semiconductor substrate having (i) a first thickness between the first back-surface region and a planar front surface opposite the back surface and (ii) between the planar front surface and a second back-surface region above a large-photodiode region adjacent to the small-photodiode region, a second thickness that exceeds the first thickness, forming the metal layer comprising:

depositing an initial metal layer on the first and second back-surface regions and in the trench; and removing regions of the initial metal layer located above the second back-surface region by planarizing the metal layer.

14. A flicker-mitigating pixel-array substrate comprising:

a semiconductor substrate including a small-photodiode region, a back surface of the semiconductor substrate forming a trench surrounding the small-photodiode region in a cross-sectional plane parallel to a first back-surface region of the back surface between a microlens and the small-photodiode region; and a metal layer that (i) at least partially fills the trench, (ii) surrounds the small-photodiode region in the cross-sectional plane, and (iii) includes a layer-region between the microlens and the small-photodiode region, the semiconductor substrate further including four large-photodiode regions forming a two-by-two array, the small-photodiode region being located at a center of the two-by-two array, the back surface of the semiconductor substrate including four coplanar surface-regions each located above a respective one of the four large-photodiode regions, a top surface of the metal layer above the small-photodiode region being coplanar with one of (i) the four coplanar surface-regions, (ii) a passivation layer formed on each of the four coplanar surface-regions, and (iii) an etch-stop layer formed on each of the four coplanar surface-regions.

15. The pixel-array substrate of claim 14, further comprising an adhesion layer covering the first back-surface region and extending into the trench between (i) the metal layer and an inner-sidewall region of the back surface and between (ii) the metal layer and an outer-sidewall region of the back surface.

16. The pixel-array substrate of claim 14, the semiconductor substrate having (i) a first thickness between the first back-surface region and planar front surface opposite the back surface and (ii) between the planar front surface and a second back-surface region above one of the four large-photodiode regions, a second thickness that exceeds the first thickness.

17. The pixel-array substrate of claim 14, further comprising the passivation layer between the metal layer and the semiconductor substrate and covering the first back-surface region and the back surface above each of the four large-photodiode regions.

18. The pixel-array substrate of claim 17, further comprising the etch-stop layer between the metal layer and the passivation layer.

* * * * *